(12) United States Patent
Iiduka et al.

(10) Patent No.: US 6,968,531 B2
(45) Date of Patent: Nov. 22, 2005

(54) EXPOSURE METHOD UTILIZING OPTICAL PROXIMITY CORRECTED EXPOSURE PATTERNS, AN APPARATUS FOR GENERATING OPTICAL PROXIMITY CORRECTED EXPOSURE DATA, AND AN EXPOSURE APPARATUS FOR OPTICAL PROXIMITY CORRECTED EXPOSURE DATA

(75) Inventors: Yoshimasa Iiduka, Kawasaki (JP);
Ryuji Kobayashi, Kawasaki (JP);
Takahisa Ito, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 306 days.

(21) Appl. No.: 10/073,246

(22) Filed: Feb. 13, 2002

(65) Prior Publication Data

US 2003/0024899 A1 Feb. 6, 2003

(30) Foreign Application Priority Data

Aug. 2, 2001 (JP) ............................. 2001-234704

(51) Int. Cl.[7] ......................... G06F 17/50; G03F 1/00
(52) U.S. Cl. ............................. 716/21; 716/19; 430/5
(58) Field of Search ................ 716/19, 21; 705/27; 703/5; 700/121; 430/5, 30, 311; 382/199, 382/149

(56) References Cited

U.S. PATENT DOCUMENTS

| 5,553,274 | A | * | 9/1996 | Liebmann | ..................... | 716/21 |
| 5,784,600 | A | * | 7/1998 | Doreswamy et al. | ....... | 713/503 |
| 6,128,067 | A | * | 10/2000 | Hashimoto | ..................... | 355/52 |
| 6,238,824 | B1 | * | 5/2001 | Futrell et al. | ................... | 430/5 |
| 6,311,319 | B1 | * | 10/2001 | Tu et al. | ......................... | 716/19 |
| 6,421,820 | B1 | * | 7/2002 | Mansfield et al. | ............. | 716/21 |
| 2002/0006562 | A1 | * | 1/2002 | Akutagawa et al. | ........... | 430/30 |
| 2002/0162079 | A1 | * | 10/2002 | Igarashi et al. | ................. | 716/2 |
| 2003/0163791 | A1 | * | 8/2003 | Falbo et al. | .................... | 716/2 |
| 2003/0198872 | A1 | * | 10/2003 | Yamazoe et al. | ............... | 430/5 |
| 2003/0203287 | A1 | * | 10/2003 | Miyagawa | ...................... | 430/5 |

FOREIGN PATENT DOCUMENTS

JP           08286358 A  * 11/1996  ............. G03F 1/08

* cited by examiner

*Primary Examiner*—A. M. Thompson
*Assistant Examiner*—Helen Rossoshek
(74) *Attorney, Agent, or Firm*—Staas & Halsey LLP

(57) ABSTRACT

In the exposure method which carries out optical proximity correction processing for exposure data having a plurality of exposure patterns and exposes a sample in accordance with such corrected exposure data, the exposure patterns to be corrected are converted, in the optical proximity correction processing, into a minus objective pattern and a minus pattern to be deleted from the minus objective pattern, to form corrected exposure data. And, the minus pattern is deleted from the minus objective pattern of the corrected exposure data to bitmap a corrected exposure pattern, to expose a sample in accordance with such bitmapped corrected exposure pattern.

12 Claims, 11 Drawing Sheets

FIG. 3
FIRST OPC PROCESSING
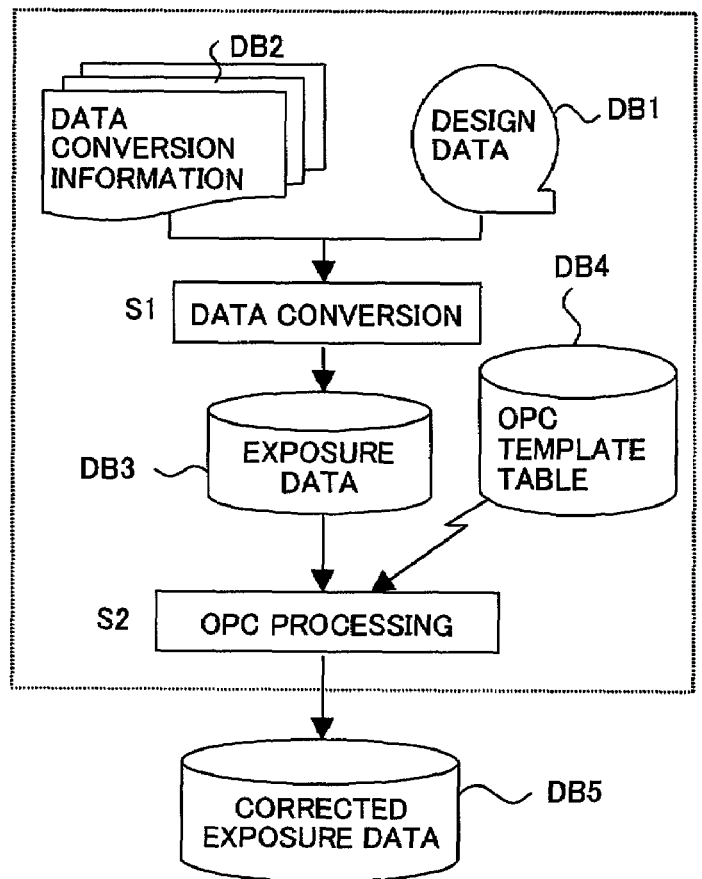
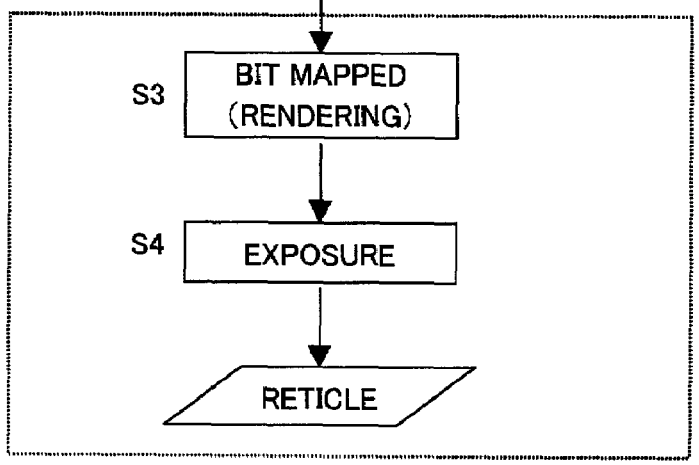

FIRST OPC PROCESSING
FIG. 4A
FIG. 4B
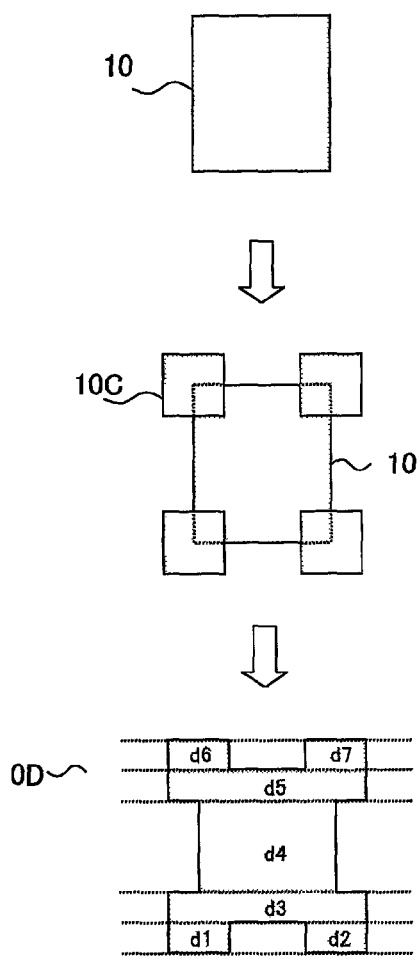
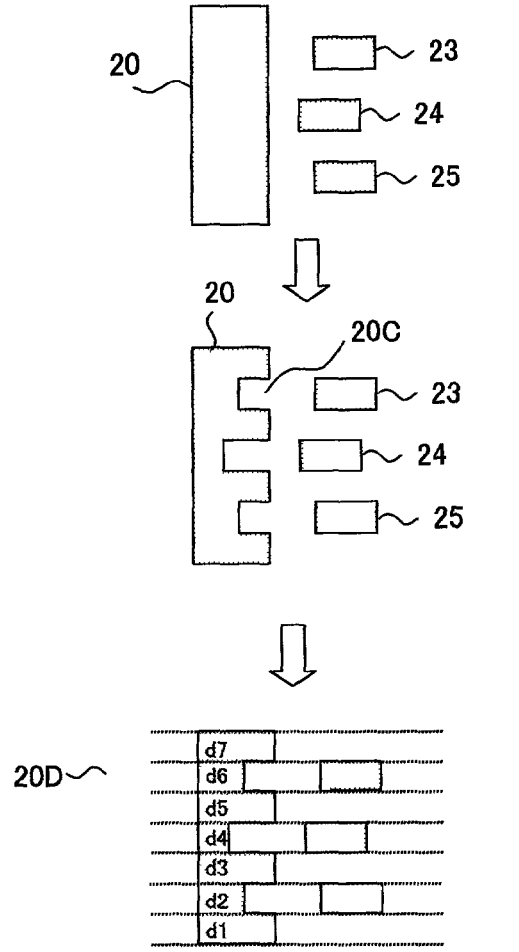
⇓ EXPOSURE, DEVELOPMENT
⇓ EXPOSURE, DEVELOPMENT
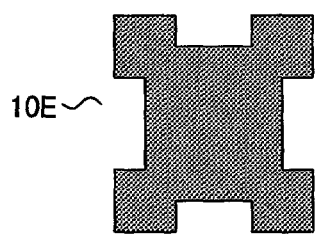
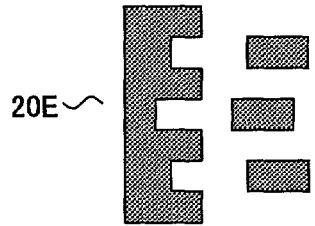

FIG. 5   SECOND OPC PROCESSING
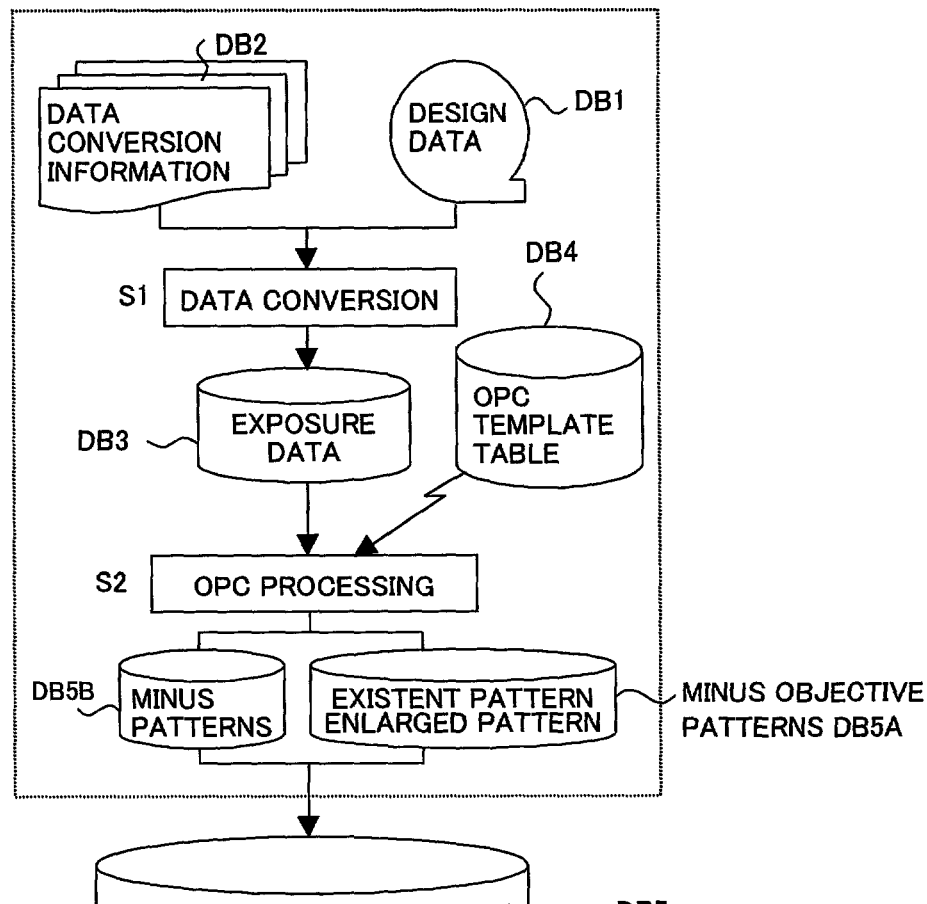

SECOND OPC PROCESSING

| A | B | DOT SIGNAL |
|---|---|---|
| 0 | 0 | 0 |
| 0 | 1 | 0 |
| 1 | 0 | 1 |
| 1 | 1 | 0 |

EXPOSURE METHOD UTILIZING OPTICAL PROXIMITY CORRECTED EXPOSURE PATTERNS, AN APPARATUS FOR GENERATING OPTICAL PROXIMITY CORRECTED EXPOSURE DATA, AND AN EXPOSURE APPARATUS FOR OPTICAL PROXIMITY CORRECTED EXPOSURE DATA

BACKGROUND OF THE INVENTION

1. Field of the Invention

The present invention relates to an exposure method which utilizes exposure patterns that have undergone an optical proximity correction (OPC), an apparatus for generating optical proximity corrected exposure data, and an exposure apparatus for the optical proximity corrected exposure data.

2. Description of the Related Arts

An optical proximity effect is known in which, in LSI exposure step, according to a frontward dispersion and rearward dispersion of exposure beams, a pattern is expanded in a region where a pattern density is high and a pattern is thinned in a region where the pattern density is low. According to such the optical proximity effect, when a pattern is exposed on a reticle mask and developed in accordance with the exposure data generated from design data, and further the pattern is exposed on a chip and developed by utilizing the reticle mask, the pattern of the reticle and the pattern of a wafer lead to a profile different from the original exposure pattern.

FIG. 1 is a diagram showing one example of the optical proximity effect. FIG. 1 shows how two kinds of pattern 1, 2 change by the optical proximity effect in the exposure pattern (1), the pattern on the reticle (2), and the pattern on the wafer (3). The square pattern 1 is a rectangular profile whose four corners are made at 90° in the exposure pattern, but when the reticle is exposed with laser beams, electron beams, or the like by utilizing the exposure pattern and developed, the pattern on the reticle leads to a profile whose four corners are slightly rounded like a pattern 1A. Furthermore, when the wafer is exposed by utilizing the reticle pattern and developed, the pattern to be formed on the wafer leads to a profile whose four corners are rounded like a pattern 1B, as shown in FIG. 1, and the square becomes approximately a round shape. This occurs by a cause that the frontward dispersion and rearward dispersion from peripheries are scarcely affected at the corners, and this cause is equal to a cause that leads to a phenomenon that a top end of a line pattern becomes a round profile, and further is thinned.

Furthermore, in the case where other patterns 3, 4 are present in proximity to the linear pattern 2, a slightly expanded profile is obtained in positions confronting the patterns 3, 4 on the reticle, as shown in a pattern 2A. This occurs by a cause that the frontward dispersion and rearward dispersion are generated due to exposure energy to the patterns 3, 4, and influences from a more proximal pattern 4 are greater. And, further when the wafer is exposed and developed by exploiting the reticle pattern, a largely expanded profile is obtained in positions confronting the patterns 3, 4, as shown in a pattern 2B.

FIG. 2 is a diagram for explaining the optical proximity correction (OPC). Taking into consideration the optical proximity effect of FIG. 1, a serif pattern 1C is added to the four corners of the square exposure pattern 1, and the reticle pattern 1A and the pattern 1B on the wafer are formed by exposing and developing according to the OPC corrected exposure pattern. The reticle pattern 1A is deformed to a profile that the corners are rounded by the optical proximity effect, and the corner of the wafer pattern 1B becomes a sharp right-angled profile. Furthermore, in the linear exposure pattern 2, a recess part 2C is added to the positions confronting the patterns 3, 4, and the exposure and development are made by the OPC corrected exposure pattern. As a result, a slightly recessed profile 2D is obtained in the reticle pattern 2A and a flat line profile is obtained in the wafer pattern 2B.

The above-described OPC is similarly effective even in the case where the exposure and development are made by drawing directly on the wafer with the electronic beams according to the exposure pattern data.

As set forth above, it is possible to restrict a profile change of the patterns after being exposed and developed accompanied by the optical proximity effect by making the OPC in the exposure pattern, and to increase the pattern precision. However, in the OPC corrected exposure pattern, a simple square or rectangle is not formed in the aforementioned example, thereby causing an increase in the number of exposure patterns. Such the increase in the number of exposure patterns leads to an increase in an exposure data amount, and an increase in a transfer time of the exposure data to an exposure apparatus, and an increase in a rendering time for bitmapping in the exposure apparatus, and a reduction in a throughput in an exposure step.

SUMMARY OF THE INVENTION

It is therefore the object of the present invention to provide an exposure method which restricts an increase in the number of the optical proximity corrected exposure patterns, an exposure data processing apparatus, and an exposure apparatus.

In order to attain the above object, according to one aspect of the present invention, in the exposure method which carries out optical proximity correction processing for exposure data having a plurality of exposure patterns and exposes a sample in accordance with such corrected exposure data, the exposure patterns to be corrected are converted, in the optical proximity correction processing, into a minus objective pattern and a minus pattern to be deleted from the minus objective pattern, to form corrected exposure data. And, the minus pattern is deleted from the minus objective pattern of the corrected exposure data to bitmap a corrected exposure pattern, to expose a sample in accordance with such bitmapped corrected exposure pattern.

According to a preferred embodiment in the present invention, in the case where the OPC is made for a corner rounding of the exposure pattern, the corrected exposure data having the minus objective pattern which is generated by enlarging the exposure pattern to be corrected and the minus pattern positioned at a side central part of such minus objective pattern is generated. And, the corrected exposure pattern which partially enlarges the corners of the exposure pattern to be corrected is generated by bitmapping. As these corrected exposure data are configured by the enlarged minus objective pattern and the minus pattern to be deleted, it is possible to restrict the increase in the number of patterns, and to restrict the increase in the data amount.

According to another preferred embodiment, in the case where the OPC is made to the linear exposure pattern so as to prevent an enlargement at positions confronting the other patterns in proximity to the linear exposure patterns, corrected exposure data having the minus objective patterns consisting of such exposure pattern to be corrected and the minus patterns in the positions confronting the other patterns are generated as the corrected linear exposure pattern. And, the corrected exposure pattern in which the linear exposure pattern to be corrected is partially thinned is generated by the bitmapping. According to these corrected exposure data, the increase in the number of pattern can be restricted.

According to a further preferred embodiment, in the aforementioned optical proximity correction processing, by comparing the case where the exposure pattern to be corrected are converted into a first corrected exposure data having the plurality of exposure patterns obtained by dividing the corrected exposure patterns with the case where the exposure pattern to be corrected are converted into a second corrected exposure data having the minus objective pattern and the minus pattern, the exposure pattern to be corrected is converted into the corrected exposure data with the smaller number of patterns. According to this embodiment, the exposure pattern to be corrected can be converted into the corrected exposure data with the fewer number of patterns.

BRIEF DESCRIPTION OF THE DRAWINGS

FIG. 3 is a flowchart in a general exposure data processing apparatus and exposure apparatus;

FIG. 4 is a diagram for explaining a first OPC processing;

FIG. 5 is a flowchart in an exposure data processing apparatus and exposure apparatus in the case where a second OPC processing is carried on;

DESCRIPTION OF THE PREFERRED EMBODIMENTS

Figure 1:
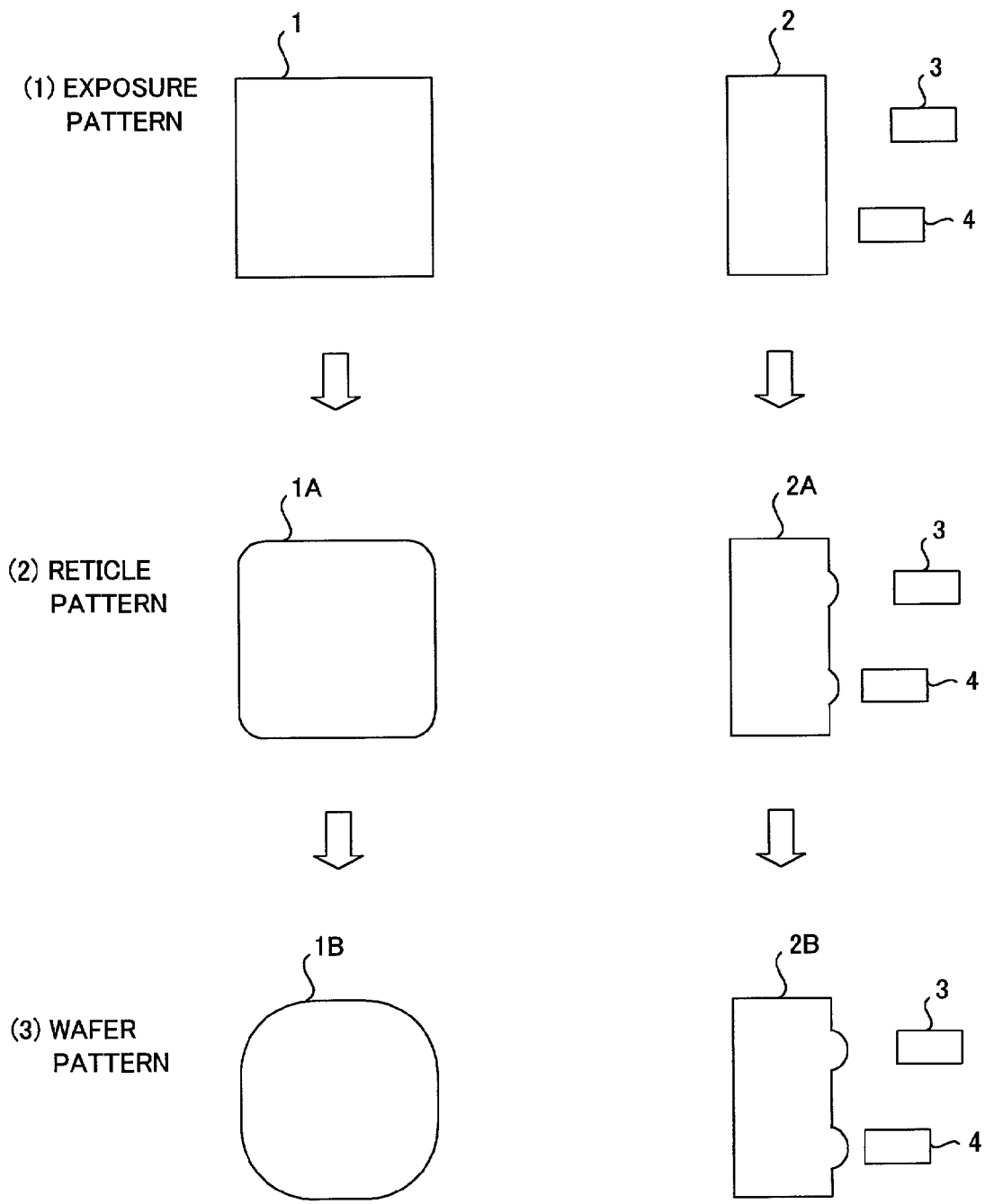
FIG. 1 is a diagram showing one example of an optical proximity effect.

Hereinafter, the embodiments of the present invention will be described with reference to the drawings. It is however to be understood that the scope of protection of the present invention is not limited to the following embodiments, but covers the invention defined in the claims and its equivalent.

FIG. 3 is a flowchart in a general exposure data processing apparatus and exposure apparatus. In the exposure data processing apparatus, design data DB1 are subjected to a data conversion processing in accordance with data conversion information DB2 (S1), and as the result, exposure data DB3 having the plurality of exposure patterns each designating an exposure region is generated. The data conversion information DB2 are parameters containing a power, a shift amount, and the like which correspond to a reticle to be exposed and developed. For example, in the case of rectangular patterns, the generated exposure data DB3 have an origin coordinate, a width and a height, and attribute data such as a profile code, etc. The exposure pattern comprises a quadrilateral rectangular pattern, a triangular pattern, a trapezoid pattern, and the like, and these profile codes are given as the attribute data. In the case of the triangular pattern, the exposure data have the origin coordinate, a length of a bottom side and a height, and the like, and in the case of the trapezoid pattern, the exposure data have the origin coordinate, lengths of an upper bottom and a lower bottom and a height, and the like.

Next, in order to cope with the optical proximity effect, the OPC processing is carried out with respect to the exposure data (S2), to generate the corrected exposure data DB5. In the OPC processing S2, the exposure patterns to be corrected are converted into the corrected exposure patterns in accordance with an OPC model table DB4. The OPC model table DB4 is a lookup table having the correspondence of the exposure patterns to be corrected to the corrected exposure patterns. This corrected exposure patterns are divided into, for example, a plurality of patterns, to generate corrected exposure data DB5 having these division patterns.

These corrected exposure data DB5 are supplied to the exposure apparatus, and the plurality of patterns included in the corrected exposure data are bitmapped (S3), and a resist on the reticle is exposed by the bitmapped pattern (S4). The bitmapping processing S3 is a processing of rendering the exposure pattern in accordance with the corrected exposure data DB5 which specifies the exposure patterns.

The steps S1, S2 of the aforementioned flowchart are carried on by an exposure data processing apparatus, and the steps S3, S4 are carried on by the exposure apparatus. Normally, the exposure apparatus is configured by a processing unit for bitmapping the exposure data generated by the exposure data processing apparatus and an exposure unit which activates exposure beams according to the bitmap data, while irradiating the exposure beams to a sample such as a reticle, or the like.

Figure 2:
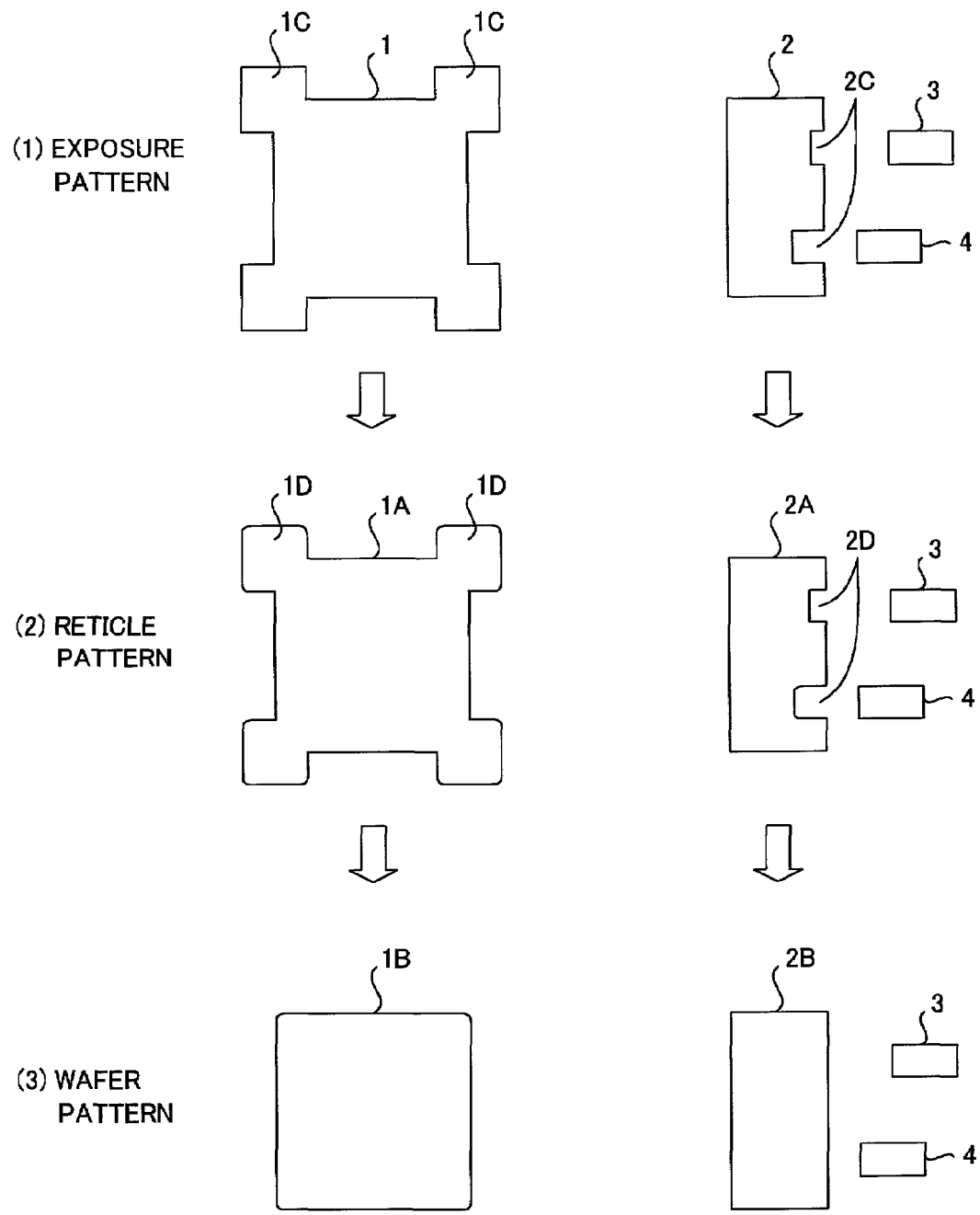
FIG. 2 is a diagram for explaining an optical proximity correction (OPC)

FIG. 4 is a diagram for explaining a first OPC processing. In the same manner as FIGS. 1 and 2, FIG. 4A shows the OPC processing with respect to the corner rounding of the exposure pattern, and FIG. 4B shows the OPC processing with respect to a thinning of the linear exposure pattern. In the OPC processing with respect to the corner rounding of the exposure pattern, a serif correction pattern 10C is added to corners of the exposure pattern to be corrected 10. And, the exposure pattern to be corrected 10 and the serif correction pattern 10C are combined to form a corrected exposure pattern 10D, which is divided into a plurality of rectangular patterns. In this example, the corrected exposure pattern is divided into seven rectangular patterns d1 to d7. Namely, the exposure pattern to be corrected 10 is converted into the corrected exposure data DB5 consisting of the seven rectangular patterns d1 to d7. As the result, such the corrected exposure data are rendered to bitmap, and a sample such as a reticle, or the like is exposed to beams in accordance with the bitmap data, and is developed, so that a correction exposure pattern 10E is formed on the reticle.

Incidentally, the OPC with respect to the corner rounding can similarly be carried on even in the trapezoid pattern or triangular pattern other than the rectangular pattern by similarly adding the serif correction pattern to the corners to partially enlarge them.

In the OPC processing with respect to the linear exposure pattern of FIG. 4(B), a line correction pattern 20C is removed in positions confronting proximal other exposure patterns 23, 24, 25 with respect to a linear pattern 20 of to be corrected. And, the removed corrected exposure pattern 20D is decomposed to the plurality of rectangular patterns. In this example also, the corrected exposure pattern 20D is divided into the seven rectangular patterns d1 to d7. The corrected exposure data DB5 consisting of the seven rectangular patterns are bitmapped to be exposed and developed, so that a correction exposure pattern 20E is formed on the reticle.

When the above corrected exposure pattern is divided into the plurality of rectangular patterns, the number of divided rectangular patterns is increased according to profiles of the corrected exposure patterns. In the example of FIG. 4, the exposure pattern to be corrected 10 consisting of a single rectangular pattern is converted into the corrected exposure pattern 10D consisting of the seven rectangular patterns. Furthermore, the exposure pattern to be corrected 20 consisting of a single linear pattern is converted into the corrected exposure pattern 20D consisting of the seven rectangular patterns. Accordingly, when the above first OPC processing is carried on, this leads to a fair increase in the number of patterns.

FIG. 5 is a flowchart in the exposure data processing apparatus and the exposure apparatus in the case where a second OPC processing is carried out. Furthermore, FIG. 6 is a diagram for explaining the second OPC processing. As shown in FIG. 5, in the exposure data processing apparatus, the design data DB1 are subjected to a data conversion processing according to the data conversion information DB2 (S1), to form the exposure data DB3. This exposure data conversion processing is same as in the case of FIG. 3. Next, in the OPC processing S2, the exposure pattern to be corrected within the exposure data is converted into a minus objective pattern DB5A and a minus pattern DB5B in accordance with the OPC model table DB4, to form the corrected exposure data DB5. The exposure pattern to be corrected is converted into the minus objective pattern DB5A and the minus pattern DB5B, thereby restricting the increase in the number of patterns.

Figure 6A:
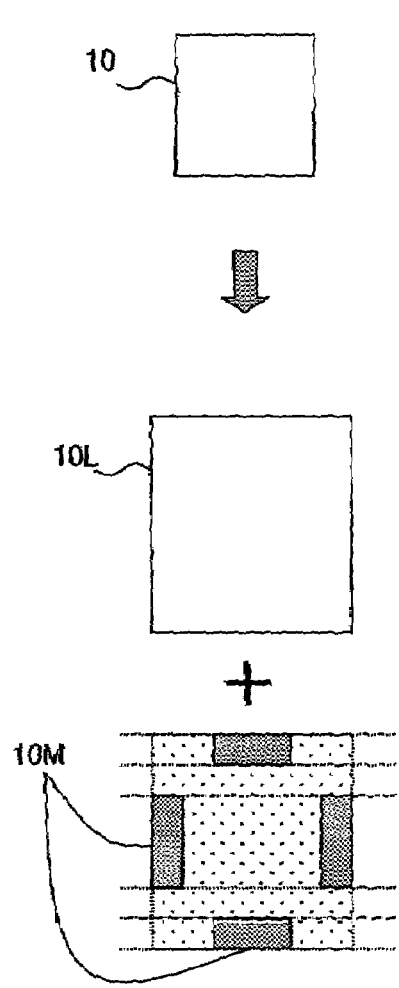
FIG. 6 is a diagram for explaining a second OPC processing.

In the OPC processing with respect to the corner rounding of the exposure pattern of FIG. 6A, for example, the rectangular pattern to be corrected 10 is converted into an enlarged pattern 10L which is obtained by enlarging the pattern to be corrected 10 at a certain ratio and a rectangular minus pattern 10M positioned at a center part of four sides of the enlarged pattern. The enlarged pattern 10L is enlarged to such a profile which is generated by connecting the four corners when the serif correction patterns are added to the pattern to be corrected 10. This enlarged pattern corresponds to the minus objective pattern DB5A. Furthermore, the four rectangular minus patterns 10M to be deleted from the enlarged pattern 10L are formed.

Return to FIG. 5, the corrected exposure data DB5 is supplied to the exposure apparatus, and such a processing is carried out that a portion of the minus pattern 10M is deleted from the enlarged pattern 10L of the corrected exposure data DB5 to bitmap the exposure region (S10). And, the exposure beams are irradiated on the reticle in accordance with the bitmapped exposure data to be exposed (S4). As the result, the exposed and developed pattern 10E on the reticle is an exposure pattern which is subjected to the OPC processing. Namely, in the same manner as in FIG. 4A, the reticle pattern 10E has a profile that the four corners are partially enlarged.

As shown in FIG. 6A, the pattern to be corrected 10 is converted into the enlarged pattern 10L and the four minus patterns 10M, and the number of patterns is five in total. And, the number of patterns is lessened in comparison with seven in the case of the first OPC processing shown in FIG. 4A.

Figure 6B:
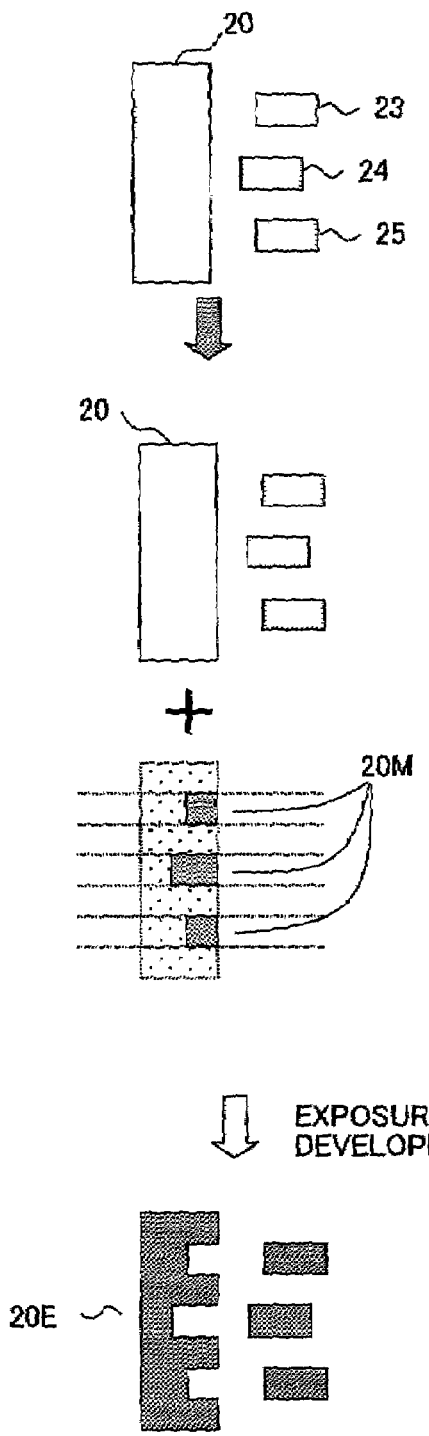

In the OPC processing with respect to a bold state of the linear exposure pattern of FIG. 6B, the pattern to be corrected 20 is set to the minus objective pattern as is, and further the minus pattern 20M for thinning the positions confronting the proximal other patterns 23, 24, 25 is generated. In this example, as the three proximal other patterns are present, the three minus patterns 20M are generated in the positions confronting the other patterns. In this case, the pattern to be corrected 20 is converted into four patterns in total, consisting of the existent pattern 20 and the three minus patterns 20M. The number of pattern is lessened in comparison with seven in the case of the first OPC processing shown in FIG. 4(B).

Then, returning to FIG. 5, the existent pattern 20 is set to the minus objective pattern, and the corrected exposure data DB5 to which the minus pattern 20M to be removed therefrom is added are supplied to the exposure apparatus. And, the minus pattern is removed from the minus objective pattern to bitmap the exposure region (S10), so that the corrected exposure pattern is bitmapped. The beam exposure is made on the reticle according to the bitmap data of this corrected exposure pattern, so that the exposure pattern 20E which is subjected to the OPC processing on the reticle is generated.

Figure 7:
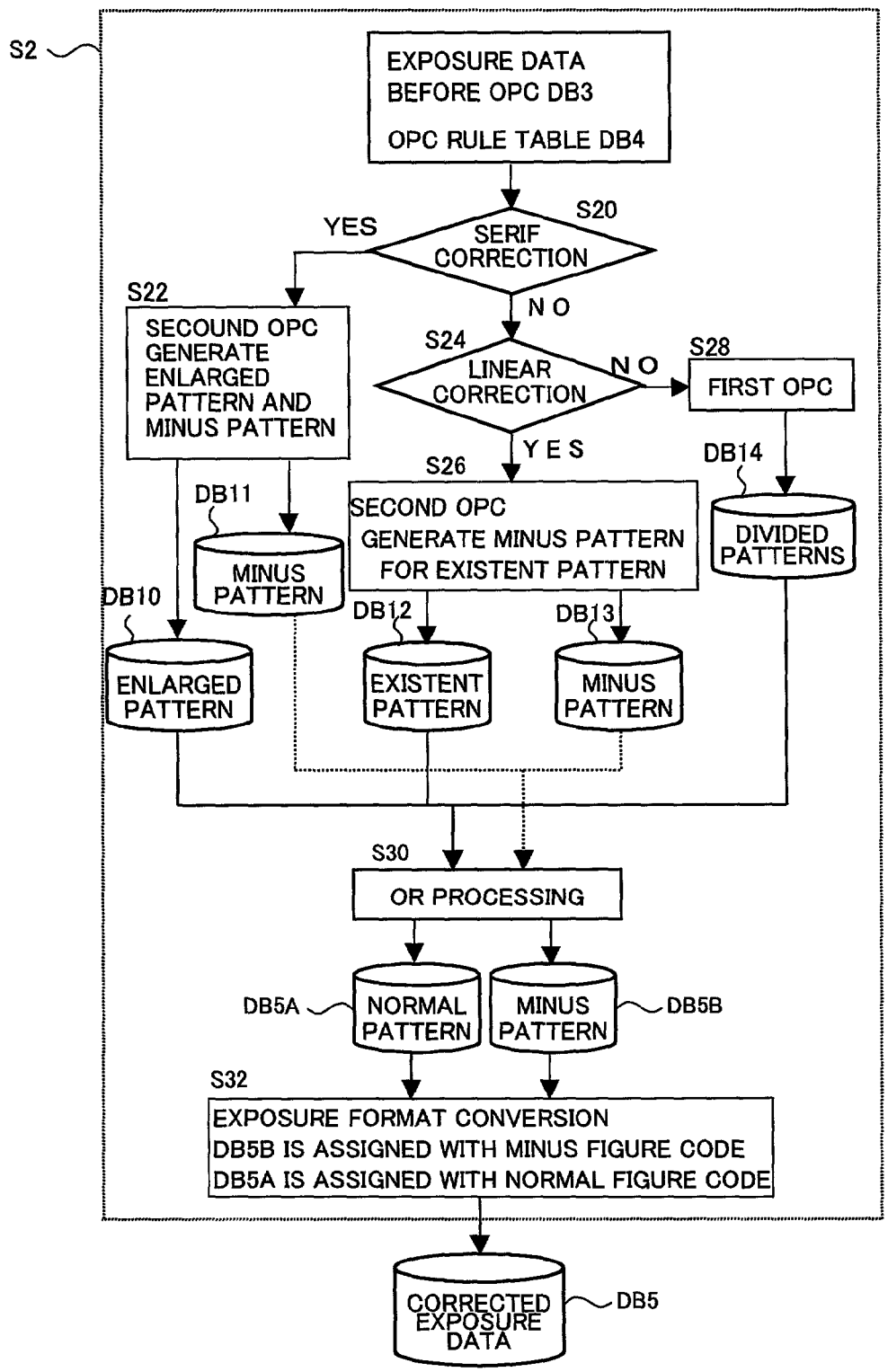
FIG. 7 is a flowchart of the OPC processing in this embodiment.

FIG. 7 is a flowchart of the OPC processing in this embodiment. In this embodiment, in the case of the OPC processing, the exposure pattern to be corrected is converted into any one of the first corrected exposure data having the plurality of exposure patterns obtained by dividing the corrected exposure pattern by the first OPC processing and the second corrected exposure data having the minus objective pattern and the minus pattern by the second OPC processing. In selecting either one, the data with the smaller number of patterns of the corrected exposure data are selected.

As shown in FIG. 7, in the OPC processing S2, it is detected with reference to the OPC rule table DB4 whether or not the exposure pattern of the exposure data DB3 before being OPC-corrected is an exposure pattern to be corrected, and in the case of a serif exposure pattern to be corrected (S20), it is subjected to the second OPC processing, to produce an enlarged pattern DB10 obtained by enlarging the exposure pattern to be corrected at a certain ratio and a minus pattern DB11 (S22), as described above. In the case of the serif correction, in any one of the exposure patterns to be corrected of a rectangle, a trapezoid and a triangle, the number of patterns is lessened in the corrected exposure data having the enlarged pattern and the minus pattern by the second OPC processing rather than by the first OPC processing. Accordingly, the serif exposure pattern to be corrected is uniformly subjected to the second OPC processing.

FIG. 8 is a diagram showing a serif correction. As shown in FIG. 4A, when the rectangular is subjected to a serif correction by the first OPC, the number of pattern reaches seven times, and on the other hand, as shown in FIG. 6A, when the rectangular is subjected to a serif correction by the second OPC, the number of pattern is limited to five times. Accordingly, it is understood that, in the serif correction with respect to the rectangular pattern, the second OPC processing is more advantageous.

Figure 8A:
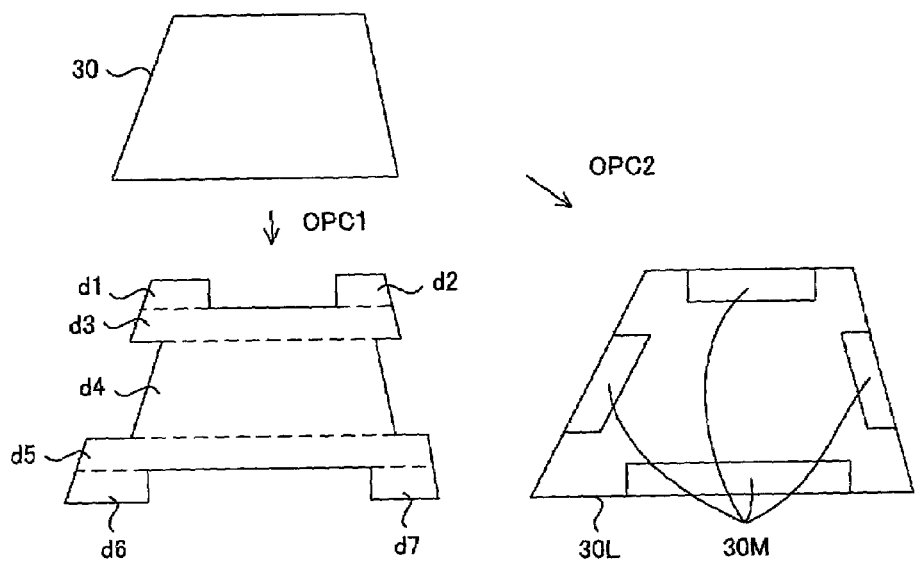
FIG. 8 is a diagram showing a serif correction.

In FIG. 8A, the exposure pattern 30 of a trapezoid is subjected to a first OPC processing OPC1, and when the exposure pattern after being corrected is divided in a horizontal direction, it is understood that the division patterns d1 to d7 and the number of patterns reaches seven times. On the other hand, when the exposure pattern 30 is subjected to a second OPC processing OPC2, and the exposure pattern to be corrected is converted into five patterns in total of an enlarged pattern 30L as the minus objective pattern and four minus patterns 30M. Accordingly, in the case of the trapezoid exposure pattern also, the second OPC processing is more advantageous.

Figure 8B:
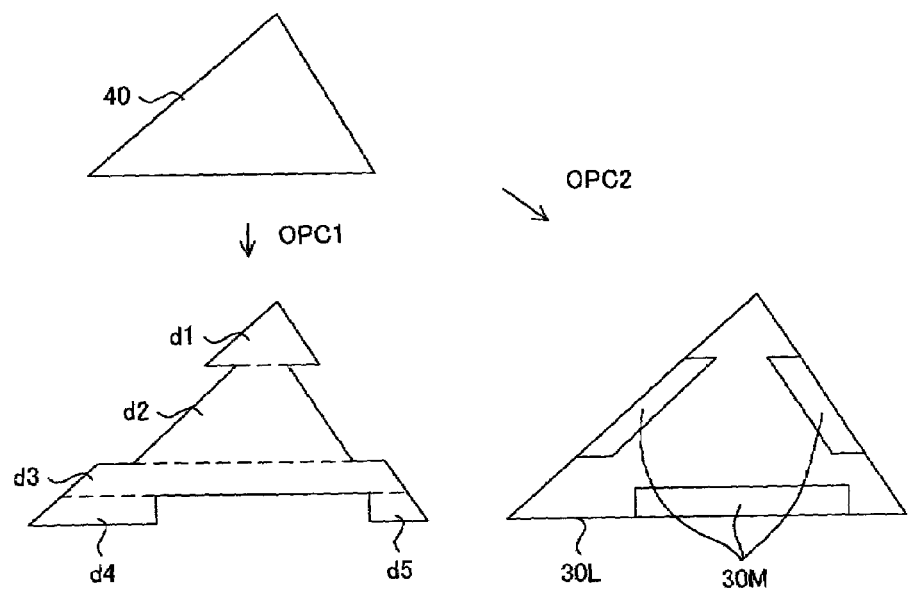

FIG. 8B shows a comparable example with respect to the a triangular exposure pattern 40, and when the exposure pattern 40 is subjected to the first OPC processing OPC1, the number of pattern reaches five times, and on the other hand, when the exposure pattern 40 is subjected to the second OPC processing OPC2, the number of pattern is limited to four times. Accordingly, in the case of the triangular exposure pattern also, the second OPC processing is more advantageous. Incidentally, the reason that a horizontal division is made in the first OPC processing is that beams are swept in a horizontal direction in the beam exposure.

Returning to FIG. 7, in the case where the exposure pattern to be corrected is subjected to a line correction, either the first OPC processing or the second OPC processing is selected depending on the exposure pattern to be corrected.

Figure 9A:
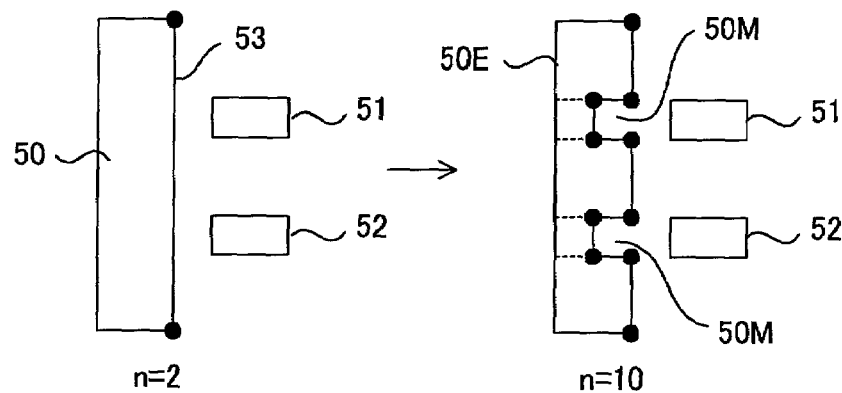
FIG. 9 is a diagram showing a line correction.

FIG. 9 is a diagram for explaining such the line correction. FIG. 9A shows the OPC of an exposure pattern to be corrected 50 having proximal exposure patterns 51, 52. In this case, in order to prevent that the exposure pattern to be corrected 50 are enlarged after being exposed and developed in an opposite side 53 confronting the proximal exposure patterns 51, 52, a recess part 50M is provided in an OPC exposure pattern 50E. In this case, when they are subjected to the first OPC processing, five division patterns are obtained, but when they are subjected to the second OPC processing, total three patterns of the single existent pattern 50 and the two minus patterns 50M are obtained. Accordingly, the second OPC processing is more advantageous.

Figure 9B:
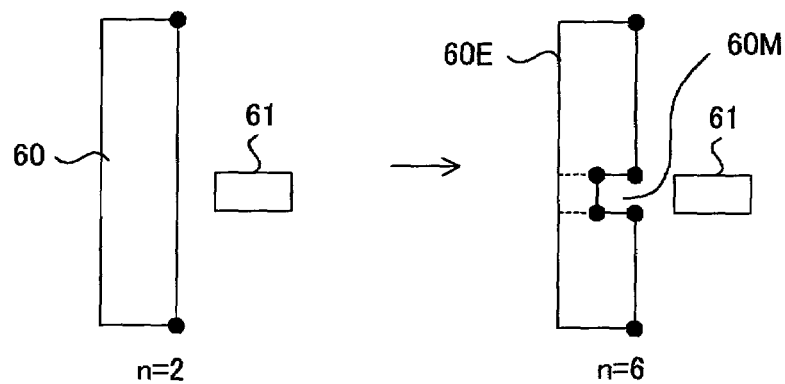

FIG. 9B shows the OPC of an exposure pattern to be corrected 60 having a proximal exposure pattern 61. In this case, in the first OPC processing, the three division patterns are obtained, but in the second OPC processing, the total two patterns of a single existent pattern and a single minus pattern 60M are obtained. Accordingly, the second OPC processing is more advantageous.

Figure 9C:
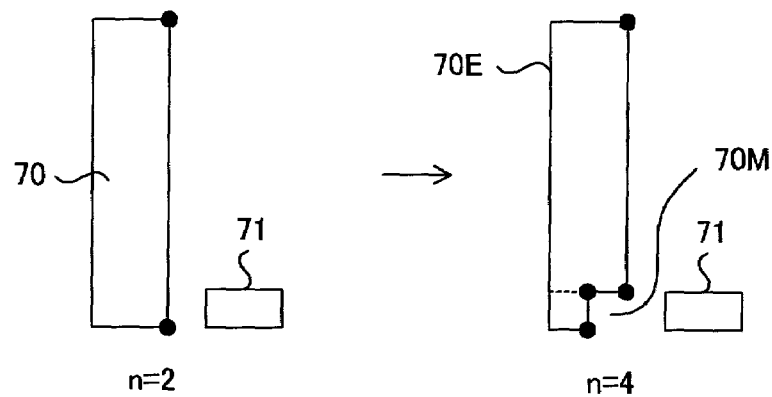

FIG. 9C shows the OPC in the case where a proximal exposure pattern 71 is included in a top end part of a line pattern 70. In this case, in both the first and second OPC processings, a correction exposure pattern 70E has two patterns.

In the above three cases, the number of vertex n at a side provided with a recess part is investigated, and as shown in the figure, n=2 before being corrected, and on the other hand, n=10, n=6, and n=4 after being corrected, respectively. Accordingly, comparing the number of vertex before being corrected with after being corrected, in the case where the difference exceeds 2, the number of patterns is smaller in the second OPC processing, and in the case where the difference in the number of vertex is 2 or less, it is understood that, in the first OPC processing also, the number of patterns is not fairly increased.

Returning to FIG. 7, in the OPC processing, in the case where the exposure pattern to be corrected corresponds to a line correction, it is judged in step S24 whether or not the number of vertex of a side forming the recess part exceeds 2 between before being corrected and after being corrected. When the number of vertex exceeds 2, the second OPC processing is carried out (S26), and a minus pattern DB13 with respect to an existent pattern DB12 which is a minus objective pattern is generated. When the number of vertex does not exceed 2, the first OPC processing is carried out (S28), and a division pattern DB14 is generated.

In the patterns DB10 to DB14 generated by the above OPC processing, the minus objective patterns DB10, DB12 and the division pattern DB14 are combined as a normal pattern DB5A, and the minus patterns DBL11, DB13 are combined as the minus pattern DB5B (S30). And, in a format conversion processing of the exposure data, a new figure code is assigned to the minus pattern DB5B, and a normal figure code is assigned to the normal pattern DB5A. Here, the figure code means a code indicating a rectangle, a trapezoid (including a parallelogram), and a triangle, and is utilized in a rendering processing to be described later. Furthermore, the figure code is allocated so as to distinguish the normal pattern DB5A from the minus pattern DB5B, thereby simplifying a processing of removing the minus pattern from the normal patterns in the rendering processing to be described later.

The corrected exposure data DB5 are generated by the above OPC processing, and are supplied to the exposure apparatus to be described later.

Figure 10:
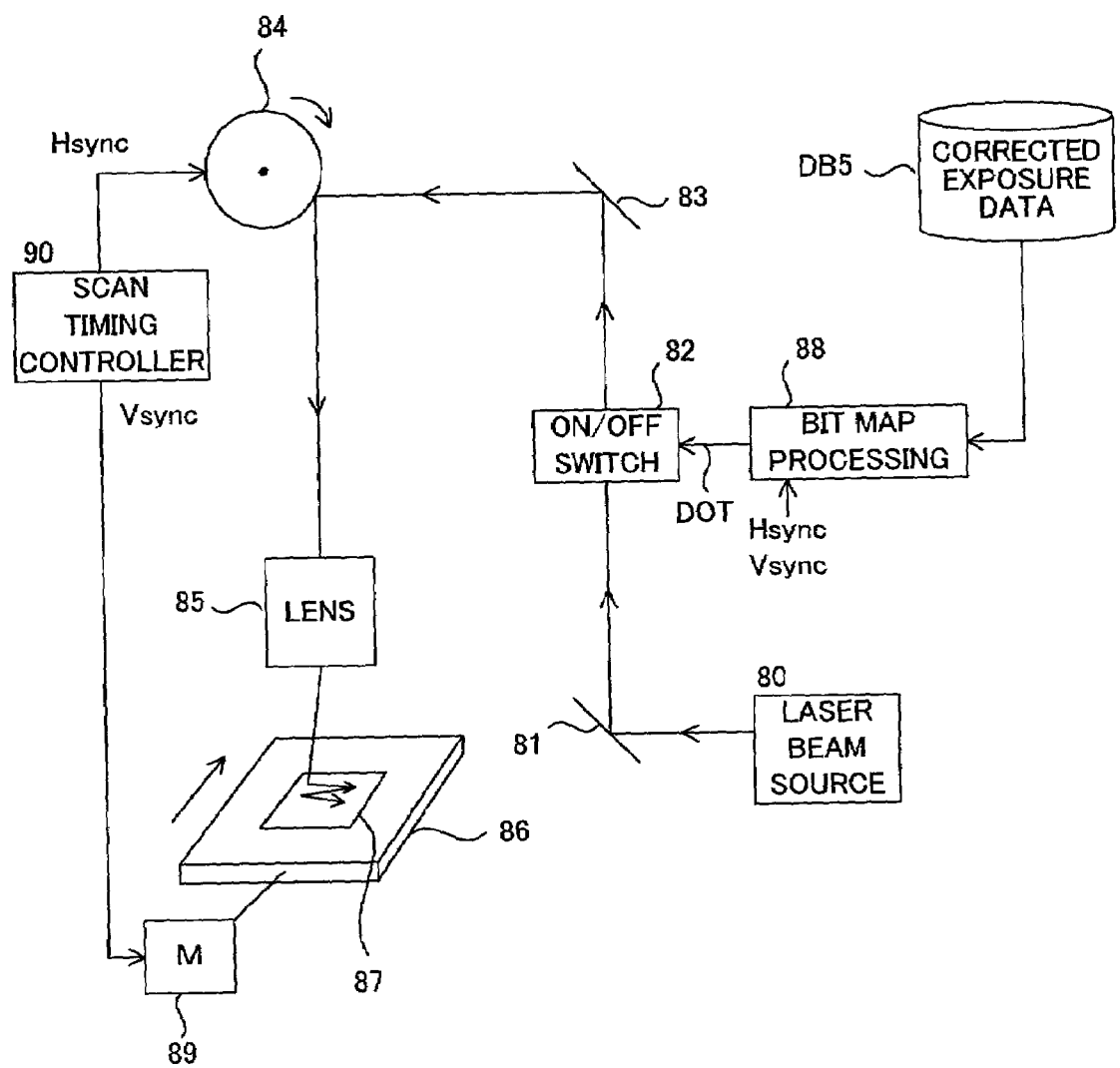
FIG. 10 is a diagram showing a schematic configuration of the exposure apparatus.

FIG. 10 is a diagram showing a schematic configuration of the exposure apparatus. This example is a laser beam exposure apparatus. Laser beams generated by a laser beam source 80 pass through a reflection mirror 81, an on/off switch 82 and a reflection mirror 83, and are irradiated to a scan mirror 84. The scan mirror 84 is a polygon mirror and scans the laser beams in a horizontal direction by rotating it. The laser beams pass through an object glass 85 and are irradiated to a reticle 87 mounted on a stage 86.

The stage 86 moves in a vertical direction by a motor 89. The scan mirror 84 is rotated according to a horizontal synchronous signal Hsync generated by a scan timing control part 90, to sweep the laser beams to a horizontal direction. Furthermore, the stage 86 moves according to a vertical synchronous signal Vsync, to scan the laser beams in a vertical direction. Thus, the laser beams raster-scans the reticle.

The exposure apparatus further has a bitmap processing unit 88 for bitmapping the exposure pattern included in the corrected exposure data DB5. This bitmap processing unit 88 produces the exposure pattern in a designated coordinate position according to the exposure data, and renders the exposure pattern, thereby producing a dot signal DOT indicating on/off of the beam irradiation at pixels. This dot signal DOT is output at a timing in synchronism with the aforementioned horizontal synchronous signal Hsync and vertical synchronous signal Vsync, and is supplied to the on/off switch 82.

Figures 11, 12:
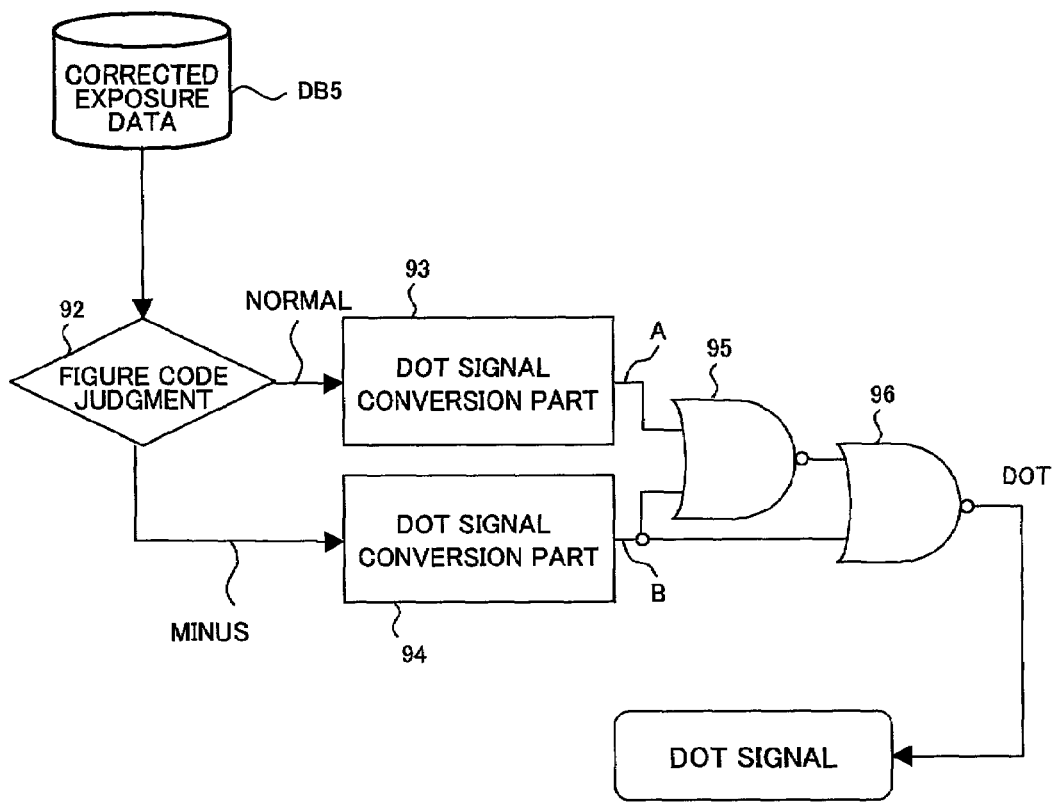
FIG. 11 is a configuration diagram of a bitmap processing unit.
FIG. 12 is a logic table of the bitmap processing unit.

FIG. 11 is a configuration diagram of the bitmap processing unit. This bitmap processing unit comprises a figure code judgment part 92 for judging a figure code of pattern data included in the corrected exposure data DB5; dot signal conversion parts 93, 94 for converting the pattern into a dot signal; and NOR gates 95, 96. The figure code judgment part 92 judges the normal figure code and the minus figure code which are provided by the format conversion processing of FIG. 7, and the normal pattern provided with the normal figure code is supplied to a dot signal conversion part 93, and the minus pattern provided with the minus figure code is supplied to a dot signal conversion part 94. And, when the respective dot signals A, B pass through the two NOR gates 95, 96, the dot signal deleting the minus pattern from the normal pattern is generated.

FIG. 12 is a diagram showing a logic value table of the two NOR gates. When the dot signal B of the minus pattern is "1" at the time of the dot signal A of the normal pattern being "1," the dot signal DOT becomes "0" (off) by a deletion. Furthermore, when the dot signal B of the minus pattern is "0" at the time of the dot signal A of the normal pattern being "1," the dot signal DOT becomes "1" (on) without the deletion. And, at the time of the dot signal A of the normal pattern being "0," the dot signal DOT becomes "0" (off). The on/off switch 82 within the exposure apparatus on/off-controls the laser beams according to this dot signal DOT.

As above, it is possible to realize the processing of removing the minus pattern from the minus objective pattern by a simple logic circuit. Accordingly, by introducing a concept of the minus pattern, it is possible to restrict an increase in a data mount of the exposure data, and an improvement in the exposure apparatus side following the increase is extremely slight.

The above embodiments were explained with the laser beam exposure apparatus as an example, but the present invention can be also applied to an exposure apparatus in which electronic beams or electric charge particle beams are irradiated on the reticle or wafer to draw the exposure pattern.

Hereinabove, according to the present invention, it is possible to restrict the increase in the number of patterns of the corrected exposure data which are subjected to the optical proximity correction, and to make easy a handling such as a transfer, a processing, or the like of the exposure data.

What is claimed is:

1. An exposure method which processes an optical proximity correction to exposure pattern data and exposes a substrate in accordance with bitmapped pattern data, the method comprising:

an optional first step of correcting the exposure pattern data, and converting the corrected exposure pattern data into plural divided exposure pattern data;

an optional second step of converting the exposure pattern data into minus objective pattern data and minus pattern data, wherein an area corresponding to the minus pattern data is included in an area corresponding to the minus objective pattern data, wherein if a number of the divided exposure pattern data is expected to be less than that of the minus objective pattern data and the minus pattern data, said optional first step is processed, and wherein if a number of the minus objective pattern data and the minus pattern data is expected to be less than that of the divided exposure pattern data, said optional second step is processed;

a bitmap processing step of generating the bitmapped pattern data by deleting the minus pattern data from a combination of the divided exposure pattern data and the minus objective pattern data; and an exposure step of exposing the substrate in accordance with the bitmapped pattern data.

2. The exposure method according to claim 1, where in the case of the optical correction for preventing corners of an exposed pattern on the substrate from being rounded, the exposure pattern data is converted into the minus objective pattern data which is an enlarged one of the exposure pattern data, and into the minus pattern data positioned on sides of the area corresponding to the minus objective pattern data.

3. The exposure method according to claim 1, wherein in the case of the optical proximity correction for preventing an enlargement at a position confronting an adjacent other pattern in a linear exposed pattern on the substrate, the exposure pattern data is converted into the minus objective pattern data consisting of the exposure pattern data, and into the minus pattern data a position confronting the adjacent other pattern.

4. An exposure system which processes an optical proximity correction to exposed pattern data and exposes a substrate in accordance with bitmapped pattern data, the system comprising:

an optical first correction processing unit which corrects the exposure pattern data, and converts the corrected exposure pattern data into plural divided exposure data;

an optical second correction processing unit which converts the exposure pattern data into minus objective pattern data and minus pattern data, wherein an area corresponding to the minus pattern data is included in an area corresponding to the minus objective pattern data, wherein if a number of the divided exposure pattern data, said optical first correction processing unit processes the correction and the conversion, and wherein if a number of the minus objective pattern data and the minus pattern data is exposed to be less than that of the divided exposure pattern data, said optical second correction processing unit processes the conversion;

a bitmap processing unit which generates the bitmapped data by deleting the minus pattern data from a combination of the divided exposure pattern data and th minus objective pattern data; and an exposure unit which exposes the substrate in accordance with the bitmapped pattern data.

5. The exposure method according to claim 4, where in the case of the optical proximity correction for preventing corners of an exposed pattern on the substrate from being rounded, the exposure pattern data is converted into the minus objective pattern data which is an enlarged one of the exposure pattern data, and into the minus pattern data positioned on sides of the area corresponding to the minus objective pattern data.

6. The exposure method according to claim 4, wherein in the case of the optical proximity correction for preventing an enlargement at a position confronting an adjacent other pattern in a linear exposed pattern on the substrate, the exposure pattern data is converted into the minus objective pattern data consisting of the exposure pattern data, and into the minus pattern data a position confronting the adjacent other pattern.

7. An exposure data processing apparatus which processes an optical proximity correction to exposure pattern data, to generate corrected exposure pattern data, the apparatus comprising:

an optical first correction processing unit which corrects the exposure pattern data, and converts the corrected exposure pattern data into plural divided exposure data;

an optical second correction processing unit which converts the exposure pattern data into minus objective pattern data and minus pattern data to be deleted from the minus objective pattern data, to generate the corrected exposure pattern data, wherein an area corresponding to the minus pattern data is included in an area corresponding to the minus objective pattern data, wherein if a number of the divided exposure pattern data is expected to be less than that of the minus pattern data and the minus pattern data, said optical first correction processing unit processes the correction and the conversion, and wherein if a number of the divided exposure pattern data, said optical second correction processing unit processes the conversion.

8. The exposure method according to claim 7, wherein in the case of the optical proximity correction for preventing corners of an exposed pattern on the substrate from being rounded, the exposure pattern data is converted into the minus objective pattern data which is an enlarged one of the exposure pattern data, and into the minus pattern data positioned on side of the area corresponding to the minus objective pattern data.

9. The exposure method according to claim 7, wherein in the case of the optical proximity correction for preventing an enlargement at a position confronting an adjacent other pattern in a linear exposed pattern on the substrate, the exposure pattern data is converted into the minus objective pattern data consisting of the exposure pattern data, and into the minus pattern data a position confronting the adjacent other pattern.

10. An exposure data processing apparatus which processes an optical proximity correction to exposure pattern data, to generate corrected exposure pattern data, the apparatus comprising:

correcting the exposure pattern data, and converting the corrected exposure pattern data into plural divided exposure pattern data if a number of the divided exposure data is expected to be less than that of the minus objective pattern data and the minus pattern data;

converting the exposure pattern data into minus objective pattern data and minus pattern data to be deleted from the minus pattern data, wherein the minus objective pattern data if a number of the minus objective pattern data and the minus pattern data is expected to be less than that of the divided exposure pattern data.

11. The exposure method according to claim 10, wherein in the case of the optical proximity correction for preventing corners of an exposed pattern on the substrate from being rounded, the exposure pattern data is converted into the minus objective pattern data which is an enlarged one of the exposure pattern data, and into the minus pattern data positioned on side of the area corresponding to the minus objective pattern data.

12. The exposure method according to claim 7, wherein in the case of the optical proximity correction for preventing an enlargement at a position confronting an adjacent other pattern in a linear exposed pattern on the substrate, the exposure pattern data is converted into the minus objective pattern data consisting of the exposure pattern data, and into the minus pattern data a position confronting the adjacent other pattern.

* * * * *

UNITED STATES PATENT AND TRADEMARK OFFICE
CERTIFICATE OF CORRECTION

| | | |
|---|---|---|
| PATENT NO. | : 6,968,531 B2 | Page 1 of 2 |
| APPLICATION NO. | : 10/073246 | |
| DATED | : November 22, 2005 | |
| INVENTOR(S) | : Yoshimasa Iiduka et al. | |

It is certified that error appears in the above-identified patent and that said Letters Patent is hereby corrected as shown below:

Column 9, Line 56, delete "where" and insert -- wherein -- therefor.
Column 9, Line 57, after "optical" insert -- proximity --.
Column 10, Line 2, after "data" insert -- at --.
Column 10, Line 5, delete "exposed" and insert -- exposure -- therefor.
Column 10, Line 8, delete "optical" and insert -- optional -- therefor.
Column 10, Line 10, after second occurrence of "exposure" insert -- pattern --.
Column 10, Line 11, delete "optical" and insert -- optional -- therefor.
Column 10, Line 17, after "data" insert -- is expected to be less than that of the minus objective pattern data and the minus pattern data --.
Column 10, Line 18, delete "optical" and insert -- optional -- therefor.
Column 10, Line 21, delete "exposed" and insert -- expected -- therefor.
Column 10, Line 22, delete "optical" and insert -- optional -- therefor.
Column 10, Line 24, after "bitmapped" insert -- pattern --.
Column 10, Line 26, delete "th" and insert -- the -- therefor.
Column 10, Line 31, delete "where" and insert -- wherein -- therefor.
Column 10, Line 45, after "data" insert -- at --.
Column 10, Line 51, delete "optical" and insert -- optional -- therefor.
Column 10, Line 53, after "divided exposure" insert -- pattern --.
Column 10, Line 54, delete "optical" and insert -- optional -- therefor.
Column 10, Line 62, after "'minus" insert -- objective --.
Column 10, Line 63, delete "optical" and insert -- optional -- therefor.
Column 10, Line 65, after "of the" insert -- minus objective pattern data and the minus pattern data is expected to be less than that of the --.
Column 10, Line 66, delete "optical" and insert -- optional -- therefor.
Column 11, Line 7, delete "side" and insert -- sides --.
Column 11, Line 15, after "data" insert -- at --.
Column 11, Line 17, delete "apparatus" and insert -- method -- therefor.
Column 11, Lines 19-20, after "data" delete ", to generate corrected exposure pattern data, the apparatus" and insert -- and exposes a substrate in accordance with bitmapped pattern data, the method -- therefor.
Column 11, Line 24, after "exposure" insert -- pattern --.
Column 12, Line 3, after "minus" insert -- objective --.
Column 12, Line 3, after "wherein" insert -- an area corresponding to the minus pattern data is included in an area corresponding to --.
Column 12, Line 14, delete "side" and insert -- sides -- therefor.
Column 12, Line 16, delete "claim 7" and insert -- claim 10 -- therefor.

UNITED STATES PATENT AND TRADEMARK OFFICE
CERTIFICATE OF CORRECTION

PATENT NO. : 6,968,531 B2
APPLICATION NO. : 10/073246
DATED : November 22, 2005
INVENTOR(S) : Yoshimasa Iiduka et al.

It is certified that error appears in the above-identified patent and that said Letters Patent is hereby corrected as shown below:

Column 12, Line 22, after "data" insert -- at --.

Signed and Sealed this

Second Day of January, 2007

JON W. DUDAS
*Director of the United States Patent and Trademark Office*